United States Patent
Cercioglu et al.

[19]

[11] Patent Number: 6,151,210
[45] Date of Patent: Nov. 21, 2000

[54] MODULAR DESIGN OF ELECTRONIC EQUIPMENT SYSTEMS

[75] Inventors: Nuri Murat Cercioglu, Chatham; Behzad Davachi Mottahed, Upper Montclair; Claire Talkin Kerr, Morris Plains, all of N.J.

[73] Assignee: Lucent Technologies Inc., Murray Hill, N.J.

[21] Appl. No.: 09/306,062

[22] Filed: May 6, 1999

[51] Int. Cl.$^7$ .................................................. H05K 7/20
[52] U.S. Cl. ..................... 361/690; 361/687; 361/695; 165/104.33; 312/223.1; 174/16.1
[58] Field of Search .................................. 361/683, 678, 361/687–695, 698, 736, 787, 696; 312/223.1, 265.3; 29/832; 62/414; 165/80.3, 80.6, 104.33, 47, 137, 104.34, 80.4; 174/16.1, 48

[56] References Cited

U.S. PATENT DOCUMENTS

| | | | |
|---|---|---|---|
| 3,298,195 | 1/1967 | Raskhodoff | 62/414 |
| 3,387,648 | 6/1968 | Ward, Jr. et al. | 165/47 |
| 3,691,432 | 9/1972 | Edfors et al. | 317/100 |
| 3,754,596 | 8/1973 | Ward, Jr. | 62/298 |
| 4,158,875 | 6/1979 | Tajima et al. | 361/695 |

*Primary Examiner*—Leo P. Picard
*Assistant Examiner*—Michael Datskovsky

[57] ABSTRACT

A modular apparatus is described which houses electronic equipment. The apparatus includes a plurality of electronic modules surrounded by an air vent system. In one embodiment, the air vent system cools the electronic components indirectly, through a connection module. In another embodiment the electronic components are cooled directly. One of the main advantages of the present invention is its modular configuration which allows additional components to be added with relative ease as the requirements of the system are expanded over time.

22 Claims, 11 Drawing Sheets

MODULAR DESIGN OF ELECTRONIC EQUIPMENT SYSTEMS

FIELD OF THE INVENTION

The present invention relates to a apparatus for housing electronic equipment, and, in particular, a modular design for housing telecommunications equipment or the like.

DESCRIPTION OF THE RELATED ART

Various apparatus presently exist for housing electronic equipment. Most are in the form of cabinets where the electronic equipment is stored within the cabinet and is accessed by a door. Since the electronic equipment often generates a great deal of heat, most of these cabinets typically include some type of cooling mechanism, for example, an air cooling system, such as a fan. However, the air cooling systems of many prior art cabinets are ineffective due to poor venting and loss of air. Further, most prior art cabinets are extremely noisy due to the ineffective venting systems. Finally, present cabinets are not easily expandable to meet the growing needs of the electronic equipment housed therein.

SUMMARY OF THE INVENTION

The present invention relates to a modular design for an apparatus for housing electronic equipment. The invention comprises a apparatus for storing and cooling a plurality of electronic modules. The apparatus includes an air vent system for carrying air to the electronic modules to cool them. The air vent system of the present invention is designed to efficiently distribute air throughout the apparatus, and reduce loss of air pressure. The electronic modules and the air vents are formed in such a way that they fit together easily and compactly. The modular shape of the components of the present invention also allows for expansion of the apparatus to meet the growing needs of the electronic equipment housed therein. Additionally, since air is distributed more efficiently in the present invention, the present apparatus is substantially quieter than prior art housings. A first embodiment of the present invention comprises four basic components, including: a backplane, a pair of air vent towers, a plurality of connector modules and a plurality of electronic modules. The air vent towers are arranged on either side of the electronic modules to provide air flow to the modules. The connector modules are used to connect the air vent towers to the electronic modules, and to connect the electronic modules to the backplane. The backplane provides a stable point of attachment for the connector modules and an electrical connection to other electronic equipment.

A second embodiment of the present invention is similar to the first embodiment except that it eliminates the connector modules from the design. By elimination of the connector modules, the overall size of the apparatus can be decreased. In place of the connector modules, the second embodiment includes openings in the sides of the electronic modules to allow air to reach the modules directly from the air vent towers. Additionally, the electronic modules are connected directly to the backplane, instead of to the connector modules.

Thus, the present invention provides a compact, easily-manufactured, and inexpensive apparatus for housing electronic equipment. The air vent system significantly reduces air flow problems and air loss and reduces noise. Further, the modular shape of the components of the apparatus allows them to be easily interchanged as the needs of the electrical equipment changes.

The above and other advantages and features of the present invention will be better understood from the following detailed description of the preferred embodiments of the invention which is provided in connection with the accompanying drawings.

DETAILED DESCRIPTION

The present invention comprises an apparatus and method for housing electronic equipment. FIGS. 1–4 and 8 show a first embodiment of the present invention, and FIGS. 5–7, 9 and 10 show a second embodiment of the present invention.

The modular nature of the components of the apparatus of the present invention allows them to fit together easily and compactly. Further, since the exemplary components may all be substantially rectangular, they are easy to manufacture. Additionally, in order to accommodate the growing needs of electronic equipment, modular components according to the present invention may simply be replaced with larger, similarly designed modular components as the amount of electronic equipment in the system increases. The shape and construction of the apparatus also reduces air loss and decreases the overall noise of the system.

Figure 1:
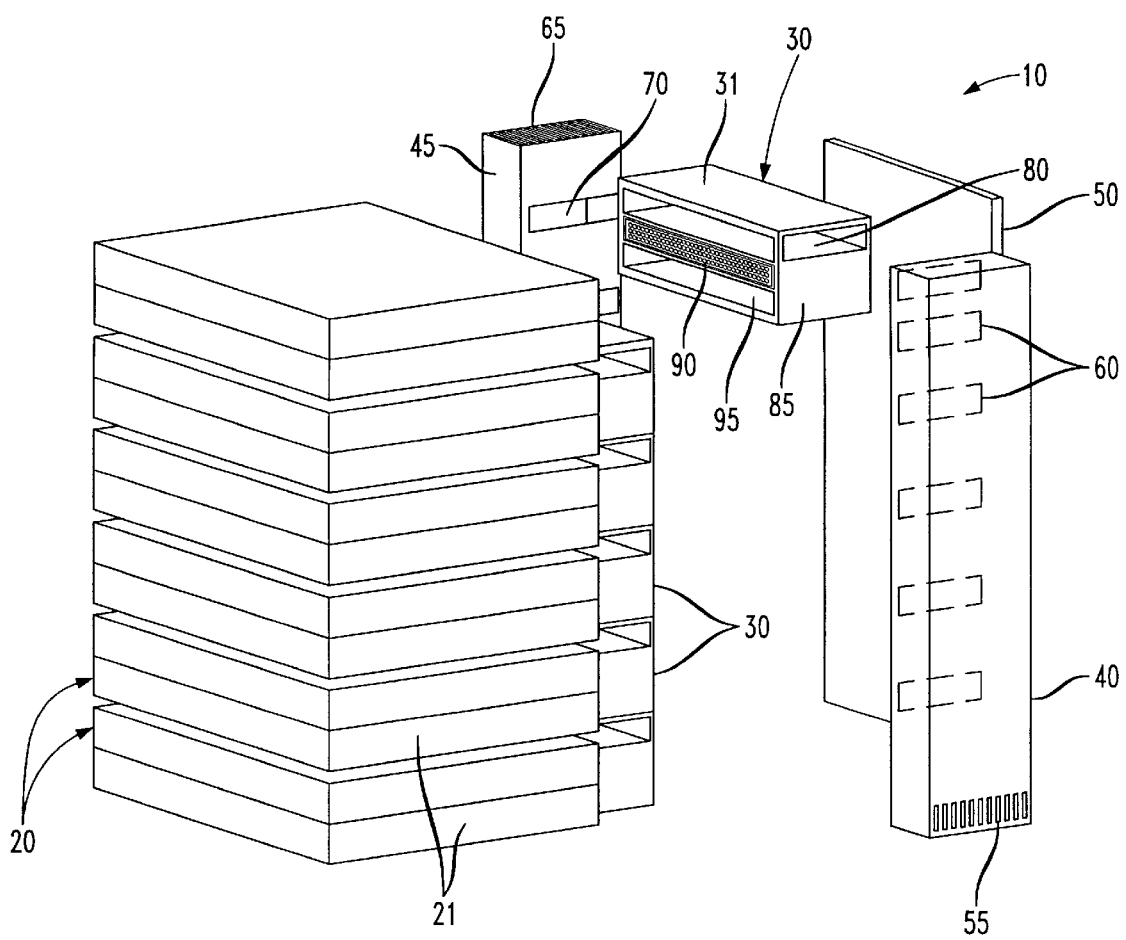
FIG. 1 illustrates an exploded view of a first embodiment of the present invention.

FIG. 1 shows the basic structure of the first embodiment. Apparatus 10, housing electronic equipment, includes a plurality of electronic modules 20, a plurality of connector modules 30, a pair of air vent towers 40, 45, and a backplane 50. The modules 20 and 30 each have respective module housings 21 and 31. In the example, the modules 20, 30, the air vent towers 40, 45, and the backplane 50 are dimensioned so that they fit together to form a substantially rectangular apparatus 10. Although in the first embodiment the apparatus 10 and modules 20, 30 are shown as having a substantially rectangular shape, the invention is not limited thereto, and the apparatus 10 and modules 20, 30 can be formed in any feasible geometric shape. Additionally, although the modules 20, 30 are oriented horizontally with respect to the air vent towers 40, 45 in FIG. 1, they may be oriented in other ways without departing from the scope of the invention (e.g. vertically).

The right air vent tower 40 includes a set of baffles 55 in a bottom portion for allowing air flow through the tower. In the first embodiment, the baffles 55 may be used as an inlet for air to the apparatus 10, the air being fed to the baffles 55 from an outside source (not shown) such as a fan. However, baffles 55 may also be used as an outlet for air. Air vent tower 40 also includes a plurality of vents 60 on the side of the tower opposite the baffles 55. The number of vents 60 corresponds to the number of connector modules 30. The left air vent tower 45 includes a set of baffles 65 located at or near its top, for example, on its top surface. In the first embodiment, the baffles 65 are used as an outlet for air from the apparatus 10, however, baffles 65 may also be used as an inlet for air when baffles 55 are used as an outlet. The air may flow out of the apparatus 10 through baffles 65 naturally, or an outside source such as a fan (not shown) may be used to extract air from the apparatus. Air vent tower 45 also includes a plurality of vents 70, corresponding in position and number to the connector modules 30. Although the vents 60, 70 shown in FIG. 1 are depicted as one size, the apparatus 10 may be manufactured so that the size of the vents 60, 70 may be adjusted so as to control the amount of airflow through the apparatus.

Each connector module 30 includes a housing 31 having three compartments 80, 85, and 90. The uppermost compartment 80 is a first passage to allow air flow between the right vent tower 40 and the connector modules 30 (and, consequently, the electronic modules 20). The center compartment 85 houses an electrical connector 90 for connecting backplane 50 to the electronic modules 20. The lowermost compartment 95 is a second passage to allow air flow between the left vent tower 45 and the connector modules 30 (and electronic modules 20).

Figure 2:
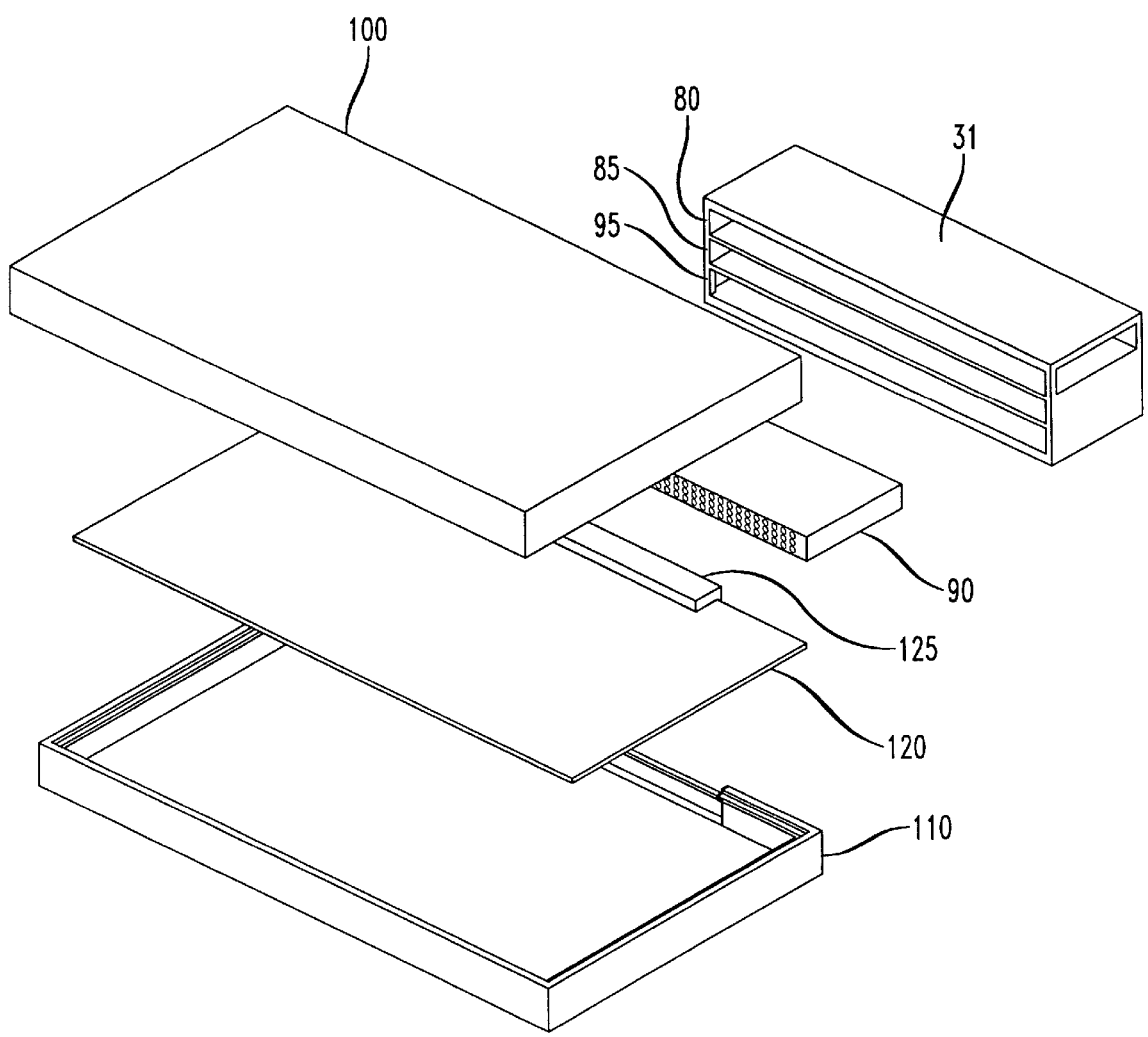
FIG. 2 illustrates an exploded view of the electronic component module and the connector module.

An exemplary configuration of the electronic modules 20 is shown in FIG. 2. As discussed above, each electronic module 20 is attached to a respective connector module 30 by an electrical connector 90 located in the central compartment 85 of each connector module. The electronic modules 20 include an upper cap 100, a lower cap 110, and a circuit card 120. The upper and lower caps 100 and 110 fit together to form module housing 21. The circuit card 120 includes an interface terminal 125 disposed along one edge. The interface terminal 125 provides a means of connecting the circuit card 120 to other modules or other electronic equipment located outside the apparatus 10. The pins (not shown) of the interface terminal 125 fit into holes in the electrical connector 90 located in the center compartment 85 of connection module 30. The electrical connector 90 is, in turn, connected to the back plane 50. The back plane 50 serves as a connection point to other electronic modules within the apparatus 10, as well as electronics in other housings (not shown). In this way, the electronic modules 20 of one apparatus 10 may be interconnected with the modules of the same or other apparatus, or other equipment.

Electronic modules 20 are formed by pressing together upper and lower caps 100, 110 to form the housing 21 that encloses the circuit card 120. When the circuit card 120 is sealed between the upper 100 and lower 110 caps, the interface terminal 125 is exposed to the exterior of the case. Depending on the configuration of the caps 100, 110, the interface terminal 125 can either protrude from, be recessed, or be flush with the sides of the caps. In any case, a space exists between the upper and lower faces of the interface terminal 125 and the upper and lower caps 110, 110. This space allows air to flow from the first passage 80 of the connector module 30, across the circuit card on an upper side, to a lower side, and back into the connector module 30 at second passage 95 when the electronic module 20 is inserted in the connector module 30. The particulars of this air flow process are explained in more detail below.

Figure 3:
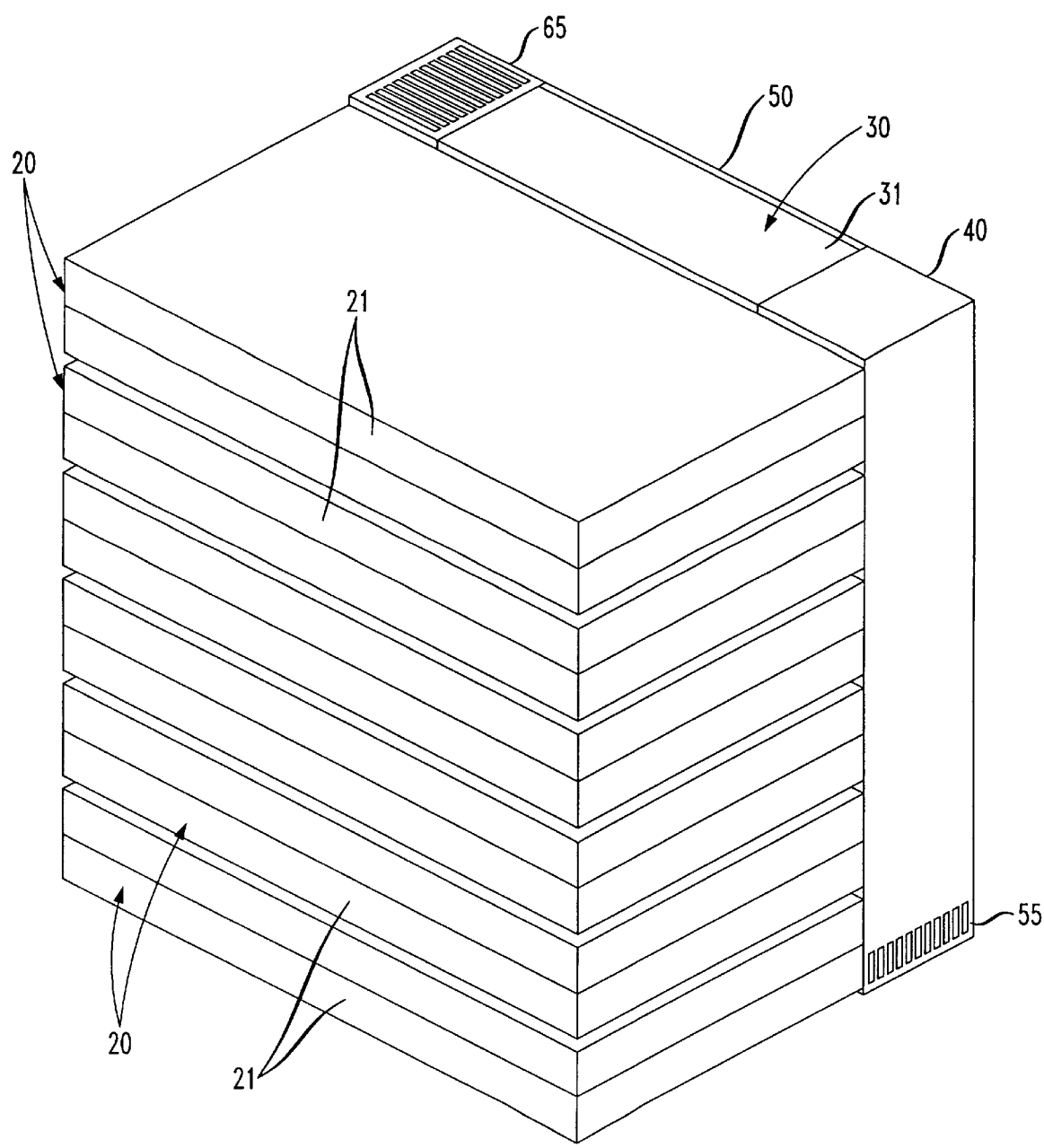
FIG. 3 illustrates a perspective view of the first embodiment of the present invention where all electronic modules are inserted.
Figure 4:
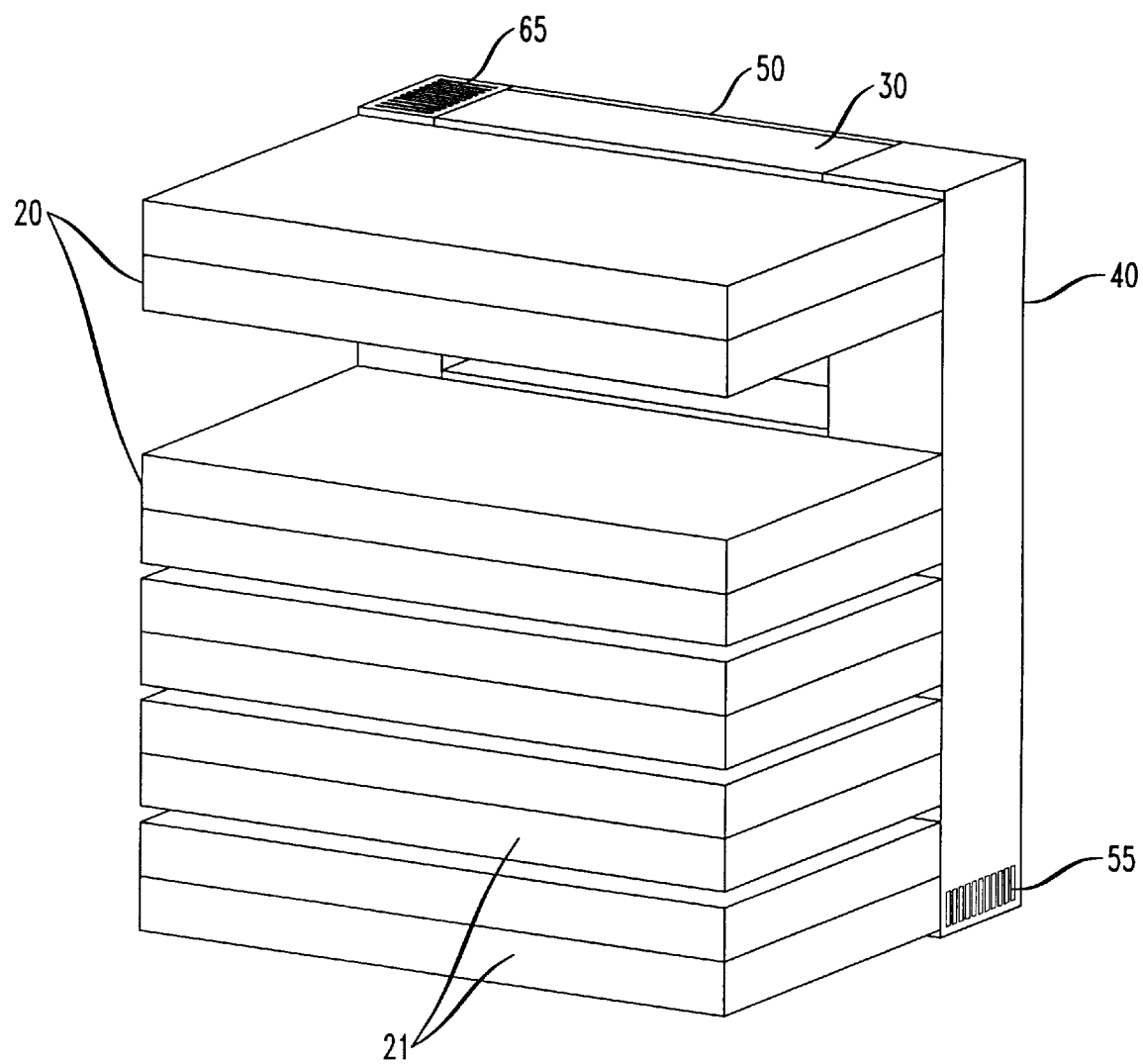
FIG. 4 illustrates a perspective view of the first embodiment of the present invention where one of the electronic modules is removed.
Figure 8:
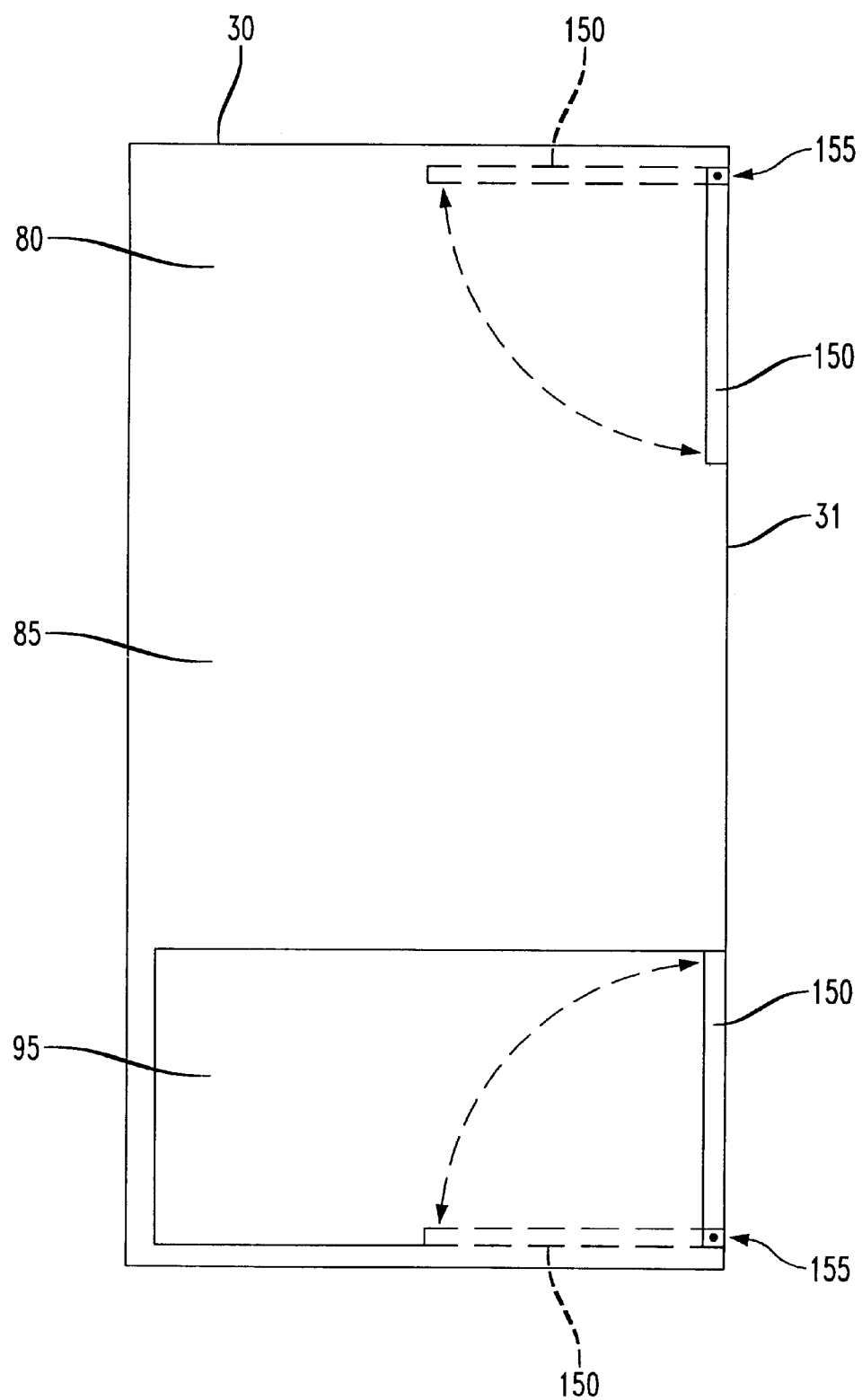
FIG. 8 illustrates a left-side elevational view of the connector module of the first embodiment showing flaps for prevention of air loss.

FIG. 3 shows the apparatus 10 with all components connected. The modular elements 20, 30, 40 and 45 form an apparatus 10 which is substantially rectangular. FIG. 4 shows the apparatus 10 of FIG. 3 with one of the electronic modules 20 removed. As shown in FIG. 8, the apparatus 10 includes flaps 150 built into each connector module 30 so that no air pressure is lost when an electronic module 20 is removed.

FIG. 8 is a left-side elevational view of a single connector module 30 showing the flaps 150 in detail. The flaps 150 are shown in phantom in their "open" position in FIG. 8 (i.e. their position when an electronic module is inserted). When an electronic module 20 is removed the flaps 150 rotate approximately 90 degrees about pivots 155 back to their "closed" position (shown in solid lines) against the front face 31 of the connector module 30. The back face of the electronic modules 20 is designed to force the flaps into their "open" position when an electronic module is inserted into the connector module 30.

The operation of the first embodiment is described below. Electronic modules 20 generate heat as they are operating. In order to keep the electronic modules 20 cool, a fan or other similar device (not shown) forces air into the baffles 55 of air vent tower 40. The forced air travels up the tower 40 and to each of the vents 60. When the air reaches each of the vents 60, it enters the first passage 80 of each of the connector modules 30. From the first passage 85, the air travels into the electronic module 20 and across the top surface of the circuit card 120. When the air reaches the back edge of the circuit card it passes to the bottom surface of the circuit card 120, across the bottom surface, out of the electronic module 20, and into second passage 95. From the second passage 95, the air is forced through the vents 70 in the left air vent tower 45. The air then exits the apparatus 10 through baffles 65 located in the top of air vent tower 45. As noted above, an additional fan may be used to extract air from the apparatus 10 through baffles 65. This air flow process serves to keep the electronic modules 20 cool, and prevents the modules from overheating and malfunctioning. Alternatively to the above, air may be forced into tower 45 through baffles 65 travel the same path and exit the apparatus 10 through baffles 55 in air vent tower 40.

FIGS. 5(a)–5(d) show a apparatus 200 according to a second embodiment of the present invention. In order to reduce the overall size of the apparatus, the connector modules 30 of the first embodiment are eliminated from the second embodiment. In the apparatus 200 shown, the right and left air vent towers 220 and 230 are connected directly to the electronic modules 210. The apparatus 200 also includes a modified backplane 205 for holding the vent towers 220, 230 and for connecting the electronic modules 210 to other electronic equipment. In order to compensate for the lack of connection modules, the electronic modules 210 are modified as described in detail below to allow air flow therethrough. Although in the second embodiment the apparatus 200 and modules 210 are shown as having a substantially rectangular shape, the invention is not limited thereto, and the apparatus 200 and modules 210 can be formed in any feasible geometric shape. Additionally, although the modules 210 are oriented horizontally with respect to the air vent towers 220, 230 in FIGS. 5(a)–5(d), they may be oriented in other ways without departing from the scope of the invention (e.g. vertically).

Right air vent tower 220 includes baffles 225 located on its top surface. In the second embodiment, the baffles 225 provide an inlet for forced or free-flowing air. Baffles 225 may alternatively be used as an outlet for air when baffles 250 are used as an inlet. On the side of the vent tower 220 facing the electronic modules 210 are a plurality of vents 240 corresponding in number and position to the electronic modules 210. As in the embodiment shown in FIG. 1, these vents 240 allow air flow from the air vent tower 220 to reach the electronic modules 210.

Left air vent tower 230 includes baffles 250 located around its bottom edge along two adjacent sides. In the second embodiment, the baffles 250 provide an outlet for forced or free-flowing air. Baffles 250 may alternatively be used as an inlet for air. On the side of the vent tower 220 facing the electronic modules 210 are a plurality of vents 260 corresponding in number and position to the electronic modules 210. The vents 260 allow air to flow from the vent tower 230 to the electronic modules 210 (See FIG. 5(c)). Although the vents 240, 260 shown in FIGS. 5(a)–5(d) are depicted as one size, the apparatus 200 may be manufactured so that the vents 240, 260 may be adjusted in size so as to control the amount of airflow through the apparatus 200.

Figure 6:
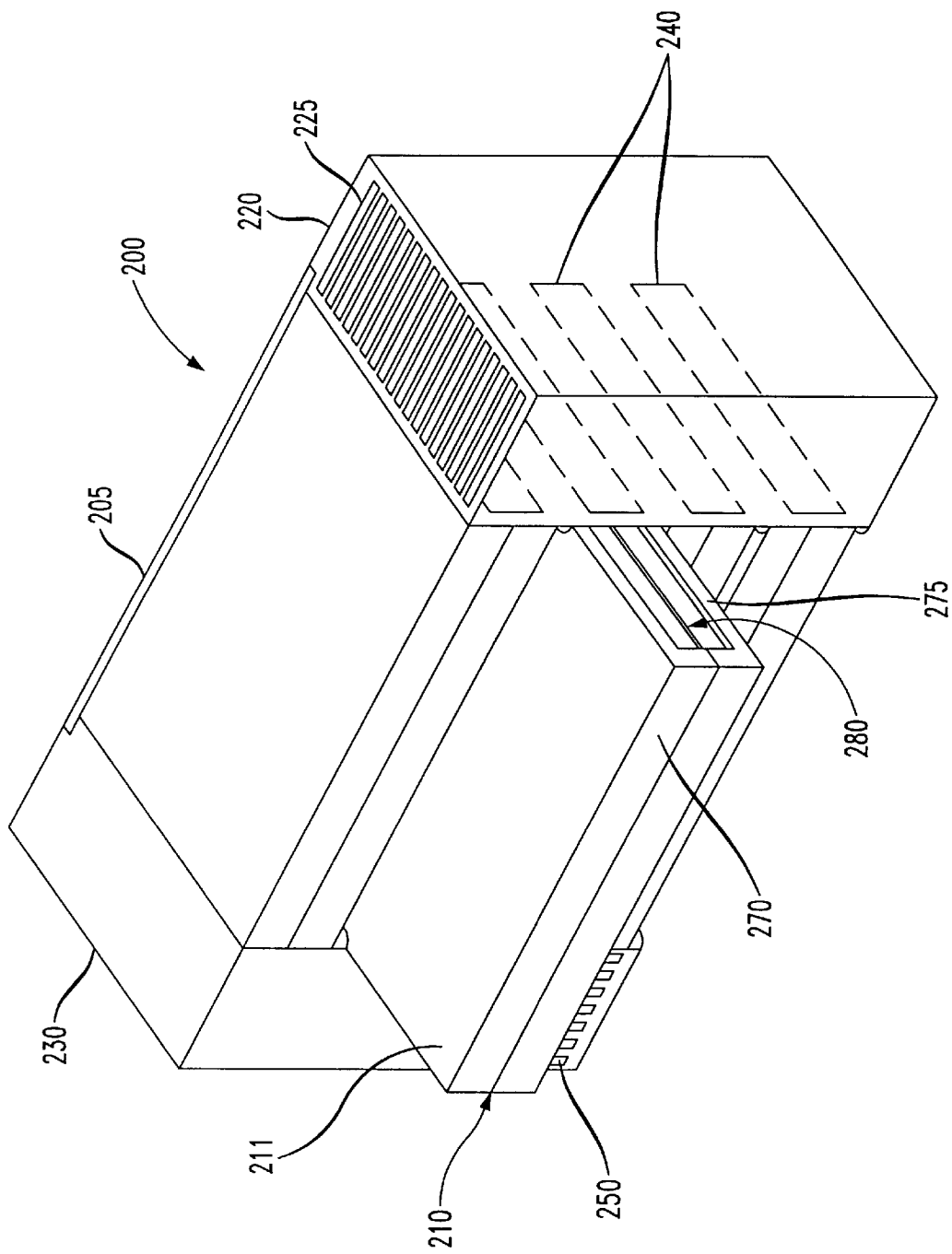
FIG. 6 illustrates a perspective view of a second embodiment of the present invention with one of the electronic modules partially removed.

FIG. 6 shows the apparatus 200 of the second embodiment with one of the electronic modules 210 partially removed. In contrast to the first embodiment, the sides of the housing 211 of electronic module 210 are left open to allow air flow through the apparatus 200. Furthermore, the vents 240, 260 in the vent towers 220, 230 are equipped with sliding walls 235 which prevent the escape of air when an electronic module 210 is removed. The specific operation of the sliding walls 235 is best understood with reference to FIG. 9.

Figure 5A:
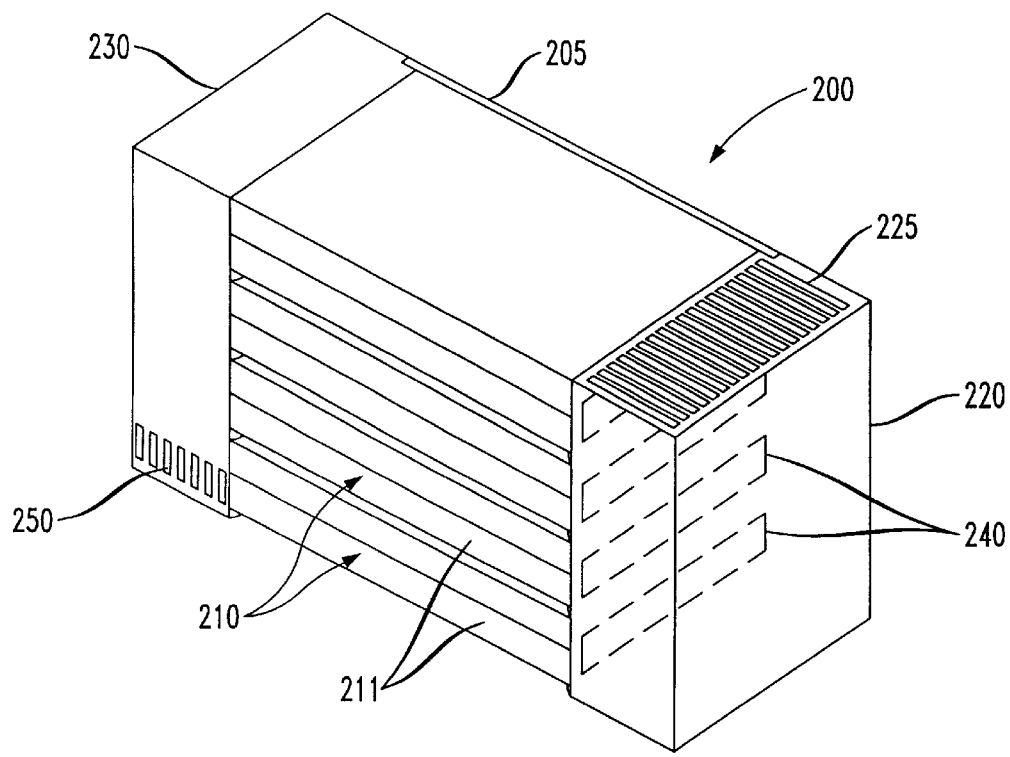
FIG. 5(a) illustrates a perspective view of a second embodiment of the present invention.
Figure 5B:
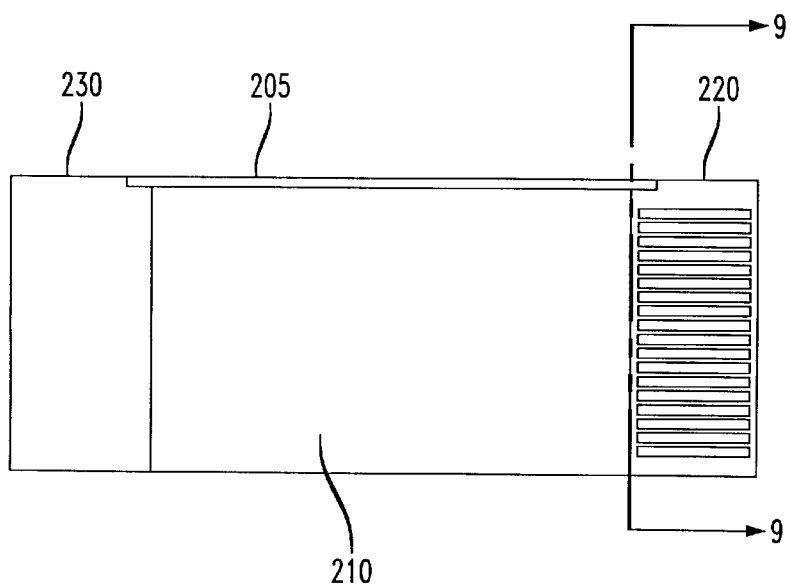
FIG. 5(b) illustrates an elevational view of a second embodiment of the present invention.
Figure 5C:
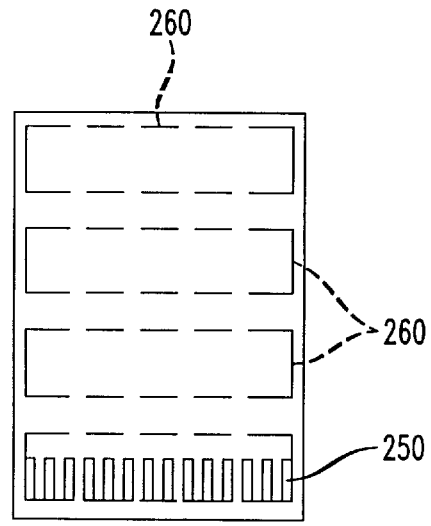
FIG. 5(c) illustrates a left-side view of a second embodiment of the present invention.
Figure 5D:
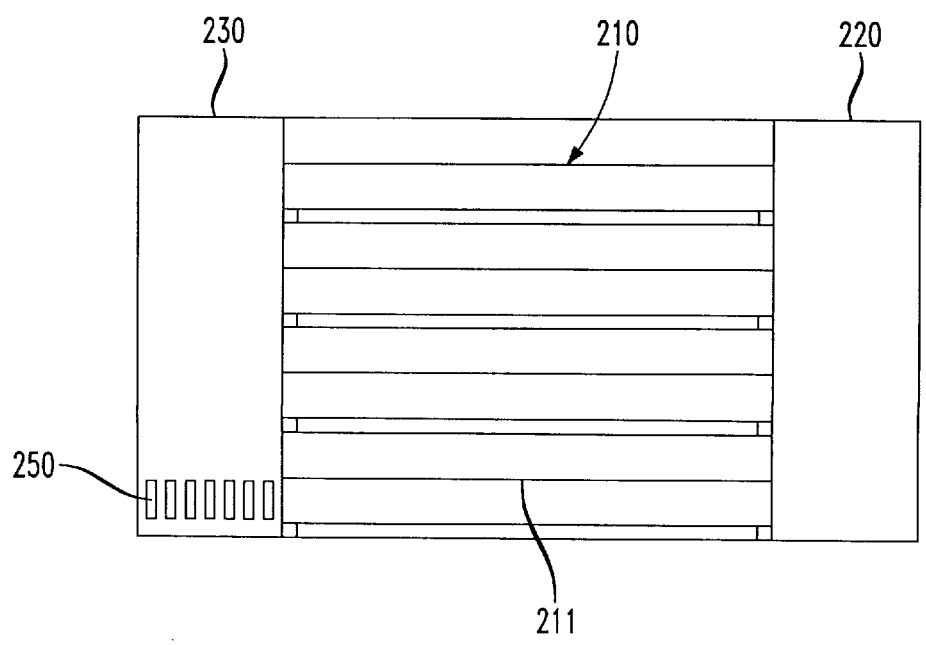
FIG. 5(d) illustrates a front view of a second embodiment of the present invention.
Figure 9:
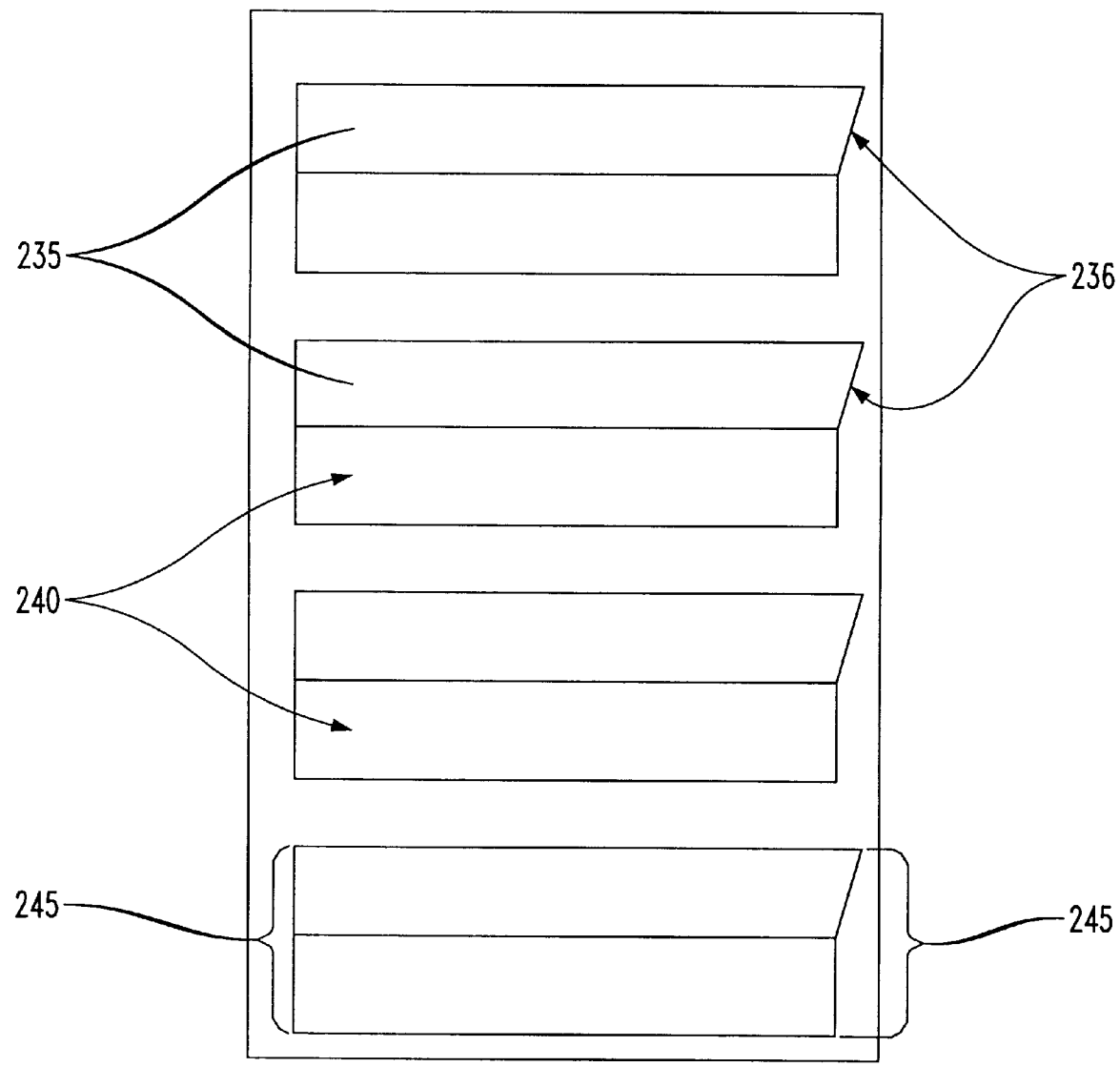
FIG. 9 illustrates a cross-sectional view of the apparatus of the second embodiment showing sliding walls for prevention of air pressure loss.
Figure 10:
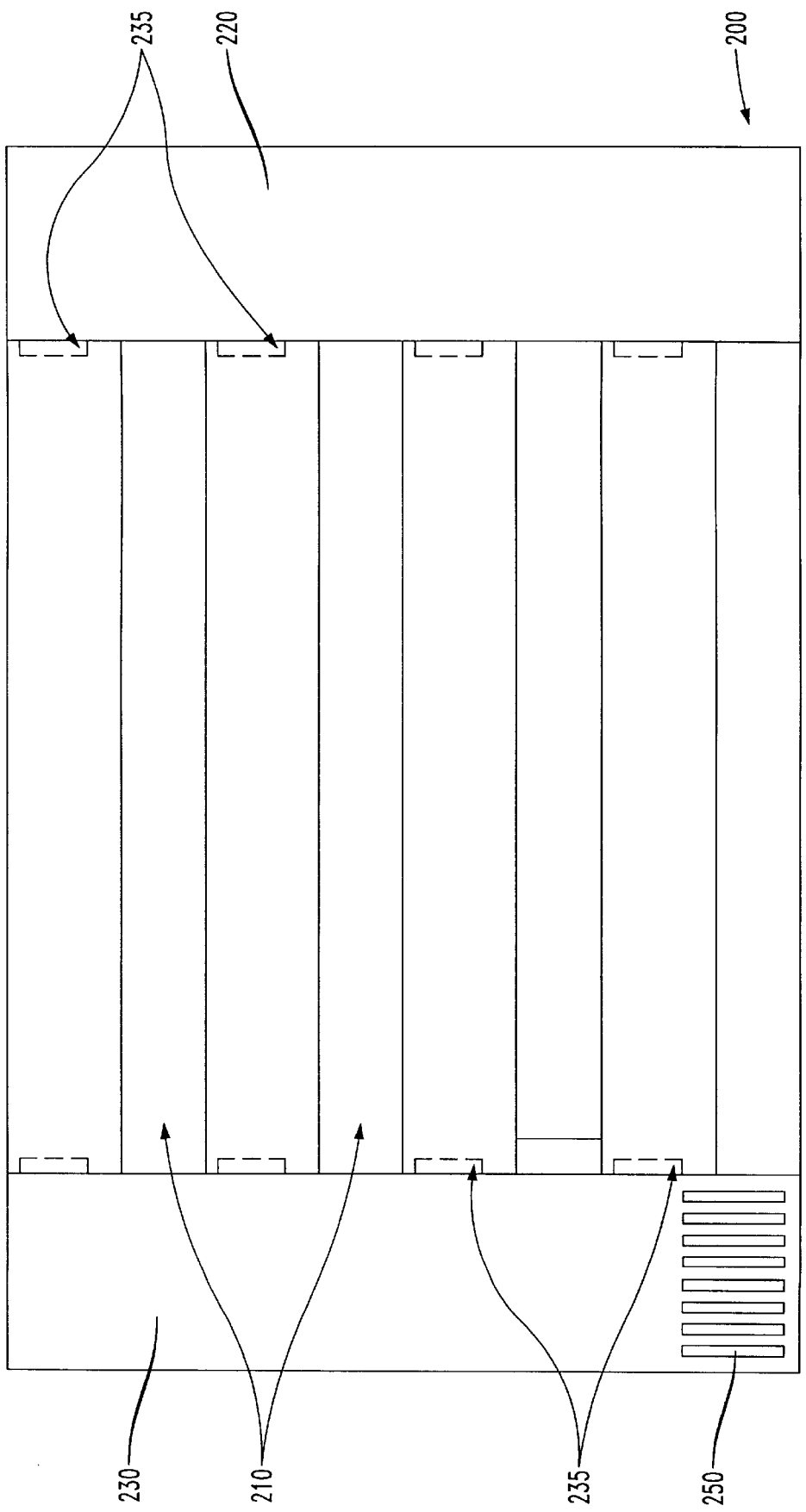
FIG. 10 illustrates a front view of the second embodiment of the present invention showing the sliding walls.

FIG. 9 shows a cross-sectional view of the apparatus 200 according to the second embodiment, taken along line '9' of FIG. 5(b). Although only the vents 240 of air vent tower 220 are shown in FIG. 9, the vents 260 of air vent tower 230 are substantially identical. The sliding walls 235 are shown in their "open" position in FIG. 9 (i.e. their position when an electronic module is inserted) The "closed" position for the sliding walls 235 exists when no electronic module is inserted and the walls 235 substantially cover vents 240 and 260. The sliding walls 235 lie in tracks 245 which are contiguous with the outer edges of the vents 240, 260. A front edge 236 of each sliding wall 235 is angled, thereby allowing it to slide upwards in its respective track 245 when confronted with a force directed at a right angle to the direction of motion of the walls. Thus, when an electronic module 210 is inserted between the air vent towers 220, 230, a front portion 236 of each sliding wall 235 is engaged by the rear face of the electronic module causing the sliding walls associated with the particular module to slide upwards in their tracks 245, and thereby allow air flow through the vents 240, 260. The sliding walls 235 are held in their "open" position above the vents 240, 260 until the electronic module is removed. When an electronic module is removed, the front edge 236 is no longer engaged, and thus gravity causes the sliding walls 235 to fall back into their "closed" position. The invention is of course not limited to sliding walls 235 which are actuated by gravity, the walls may be opened and closed by any means known in the art (e.g. spring-loaded actuators). The sliding walls 235 can be seen more clearly with reference to FIG. 10. FIG. 10 shows a front view of the apparatus 200 where the sliding walls are shown in their "open" position in phantom.

Figure 7A:
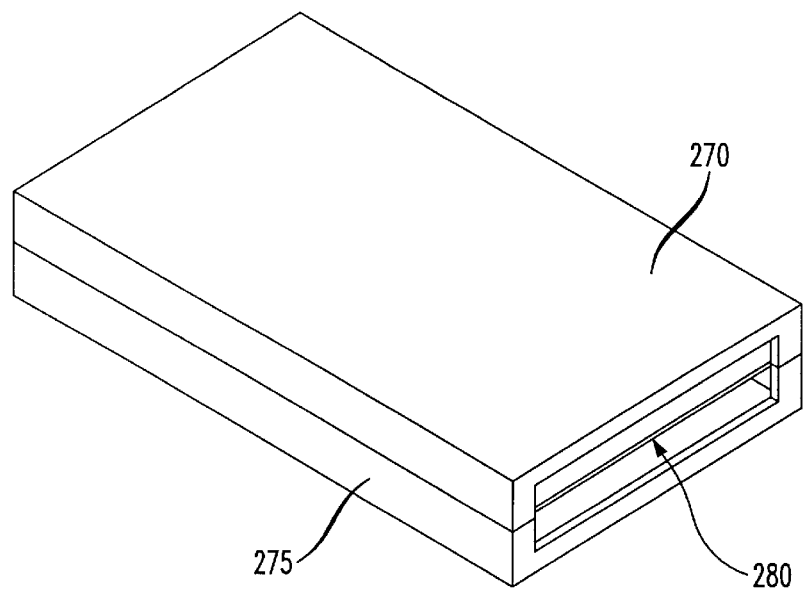
FIG. 7(a) illustrates an electronic module of the second embodiment of the present invention.
Figure 7B:
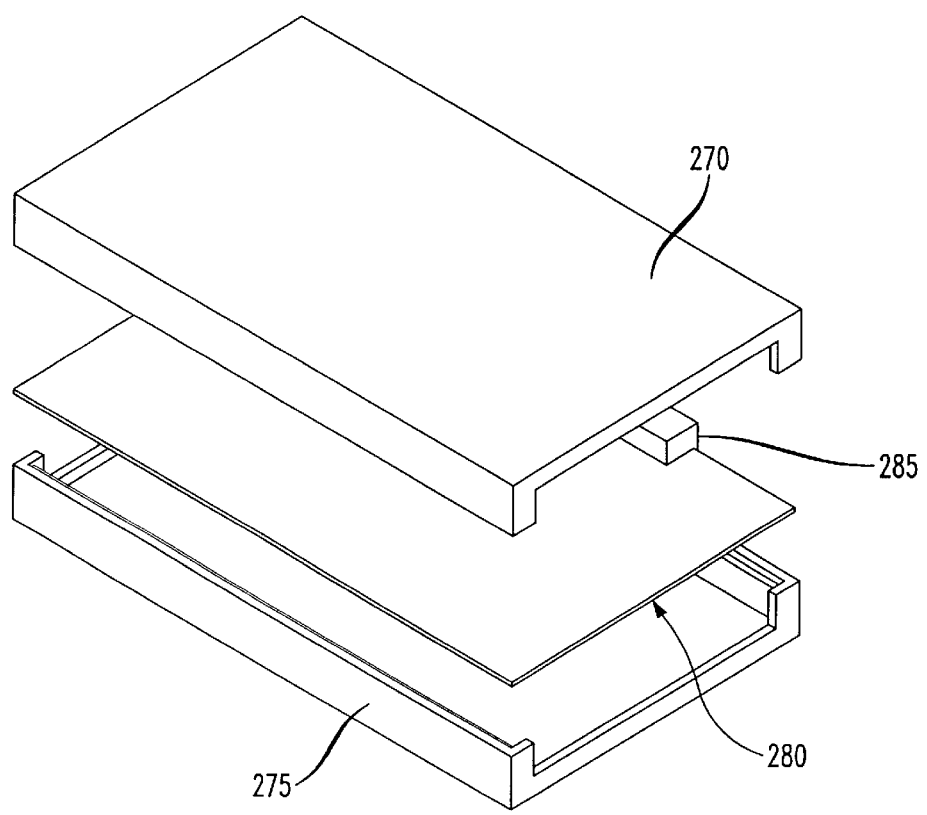
FIG. 7(b) illustrates an exploded view of the electronic module shown in FIG. 7(a).

An exemplary configuration of the electronic module 210 is shown in detail in FIGS. 7(a) and 7(b). FIG. 7(a) shows the electronic module in its assembled form, and FIG. 7(b) shows the module in exploded view. Like the electronic modules 20 of the first embodiment, the electronic modules 210 of the second embodiment include an upper cap 270, a lower cap 275, and a circuit card 280. The upper cap 270 and the lower cap 275 form the housing 211 of the electronic module 210. The circuit card 280 includes an interface terminal 285 for connecting to an electrical connector (not shown) located in the back plane 205 of the apparatus 200. Like the electronic module 20 of the first embodiment, the interface terminal 285 may protrude from, be recessed, or be flush with the sides of the caps 270, 275. In this embodiment, the caps 270, 275 of housing 211 are U-shaped, so that when they are assembled the electronic modules 210 have sides which are open. Thus, when the modules 210 are inserted into the apparatus 200 (See FIG. 6), the open sides are aligned with the vents 240, 260 to allow air flow through the modules. In this way, the apparatus 200 of the second embodiment serves to keep the electronic modules 210 cool, and prevents the overall system from overheating and malfunctioning.

The operation of the second embodiment is described below. In order to cool the electronic modules 210, a fan or other similar device (not shown) forces air into baffles 225 of air vent tower 220. The forced air travels downward into the tower 220 and out through vents 240. From the vents 240, the air passes directly into the electronic modules 210 through the openings formed by the cooperation of the upper and lower caps 270, 275. The air passes over the circuit board 280 and out of the electronic modules 210 through a similar opening on the other side of the module, and then to vents 260 of air vent tower 230. The air then exits the apparatus 200 through baffles 250 located in air vent tower 230. As noted above, an additional fan may be used to suck the air out of the apparatus 200 through baffles 250. As with the first embodiment, air may be alternately forced into air baffles 250 of vent tower 230, travel the same path described above in the opposite direction, and exit the apparatus 200 through baffles 225 of vent tower 220.

Although the invention has been described with respect to exemplary electronic modules in the form of circuit cards stored in box-type housings, the present invention is usable with any electronic equipment which requires cooling. Additionally, although the invention has been described as using sliding walls or flaps to maintain air pressure within the apparatus, any mechanical means for opening and closing an aperture may be utilized without departing from the scope of the present invention.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. An apparatus for housing electronic equipment comprising:
    a plurality of electronic module housings; and,
    an air vent system connected to each of the plurality of electronic module housings, said air vent system comprising first and second towers disposed on opposing sides of the plurality of electronic module housings,
    wherein each of the plurality of electronic module housings comprises a case which encloses a circuit card at its upper and lower surfaces having an interface terminal disposed along one side thereof, said case allowing access to the interface terminal through the exterior of the case.

2. The apparatus of claim 1, further comprising:
    a plurality of connector module housings connecting the air vent system and the plurality of electronic module housings.

3. The apparatus of claim 2, wherein each of the plurality of electronic module housings comprises:
    a case which encloses a circuit card having an interface terminal disposed along one side thereof, said case allowing access to the interface terminal through the exterior of the case.

4. The apparatus of claim 2, wherein each of the plurality of connector module housings comprises:
    at least one compartment for housing an electrical connector;
    a first passage for allowing air to flow between the connector module housing and the first air cooling tower; and,
    a second passage for allowing air to flow between the connector module housing and the second air cooling tower.

5. The apparatus of claim 4, wherein said first tower includes a plurality of openings, each opening corresponding to a respective one of said first air flow passages located in said plurality of connector module housings.

6. The apparatus of claim 4, wherein said second tower includes a plurality of openings, each opening corresponding to a respective one of said second air flow passages located in said plurality of connector module housings.

7. The apparatus of claim 3, wherein each interface terminal electrically connects a respective electronic module housing to a respective electrical connector disposed in a respective connector module housings.

8. The apparatus of claim 2, wherein the first tower includes baffles at a lower portion thereof.

9. The apparatus of claim 8, wherein said first tower includes a plurality of openings in a side opposite the baffles thereof, each opening corresponding to a respective air flow passage located in a respective one of said plurality of connector module housings.

10. The apparatus of claim 2, wherein the second tower includes baffles at an upper portion thereof.

11. The apparatus of claim 10, wherein said second tower includes a plurality of openings in a side adjacent to the baffles thereof, each opening corresponding to a respective air flow compartment located in a respective one of said plurality of connector module housings.

12. The apparatus of claim 1, wherein the circuit card has sides which are not enclosed by the case, and the unenclosed sides allow air to flow through the case between the first and second towers.

13. The apparatus of claim 12, wherein each of the first and second towers includes an opening in a side facing the electronic module housings, in a position corresponding to a position of one of the electronic module housings.

14. The apparatus of claim 2, wherein at least one of the plurality of electronic module housings is removable.

15. The apparatus of claim 14, wherein each connector module includes at least one door that closes so as to prevent escape of air pressure from the apparatus when an electronic module housing is removed.

16. The apparatus of claim 1, wherein at least one of the plurality of electronic module housings is removable.

17. The apparatus of claim 16, wherein openings in each tower include a door that closes so as to prevent escape of air from the apparatus when an electronic module housing is removed.

18. An apparatus for housing electronic equipment comprising:
    a plurality of electronic module housings; and
    an air vent system connected to each of the plurality of electronic module housings, said air vent system comprising first and second towers disposed on opposing sides of the plurality of electronic module housings, wherein both the plurality of electronic module housings and the first and second towers are substantially rectangular, said towers being connected on opposite sides of said plurality of electronic module housings so that the entire apparatus comprises a single substantially rectangular unit.

19. The apparatus of claim 1, further comprising:

a plurality of substantially rectangular connection modules;

wherein both the plurality of electronic module housings and the first and second towers are substantially rectangular, said towers being connected on opposite sides of said plurality of electronic module housings and said plurality of connection modules so that the entire apparatus comprises a single substantially rectangular unit.

20. An apparatus for housing electronic equipment comprising:

a plurality of electronic modules;

an air vent system connected to each of the plurality of electronic modules, said air vent system comprising first and second towers disposed on opposing sides of the plurality of electronic modules; and, a plurality of connection modules connected to said air vent system and disposed between said first and second towers.

21. An apparatus for housing electronic equipment comprising:

a plurality of electronic module housings;

an air vent system connected to each of the plurality of electronic module housings, said air vent system comprising first and second towers disposed on opposing sides of the plurality of electronic module housings; and, a plurality of connector module housings connecting the air vent system and the plurality of electronic module housings, wherein each of the connector module housings comprises at least one compartment for housing an electrical connector; a first passage for allowing air to flow between the connector module housing and the first tower; and, a second passage for allowing air to flow between the connector module housing and the second tower.

22. An apparatus for housing electronic equipment comprising:

a plurality of electronic module housings; and, an air vent system connected to each of the plurality of electronic module housings, said air vent system comprising first and second towers disposed on opposing sides of the plurality of electronic module housings, wherein the first tower includes baffles at a lower portion thereof.

* * * * *